(12) United States Patent
Galela et al.

(10) Patent No.: US 9,925,616 B2
(45) Date of Patent: Mar. 27, 2018

(54) METHOD FOR FUSING NANOWIRE JUNCTIONS IN CONDUCTIVE FILMS

(71) Applicant: SAMSUNG DISPLAY CO., LTD., Yongin, Gyeonggi-Do (KR)

(72) Inventors: Jennifer J. Galela, San Carlos, CA (US); Jiuzhi Xue, Broomfield, CO (US)

(73) Assignee: Samsung Display Co., Ltd., Yongin-si (KR)

( * ) Notice: Subject to any disclaimer, the term of this patent is extended or adjusted under 35 U.S.C. 154(b) by 398 days.

(21) Appl. No.: 14/567,983

(22) Filed: Dec. 11, 2014

(65) Prior Publication Data

US 2015/0174687 A1  Jun. 25, 2015

Related U.S. Application Data

(60) Provisional application No. 61/920,402, filed on Dec. 23, 2013.

(51) Int. Cl.
| | |
|---|---|
| *B23K 11/00* | (2006.01) |
| *B23K 20/10* | (2006.01) |
| *B23K 20/00* | (2006.01) |
| *B23K 11/16* | (2006.01) |
| *B23K 11/24* | (2006.01) |
| *H01L 31/0224* | (2006.01) |

(52) U.S. Cl.
CPC ........ *B23K 11/008* (2013.01); *B23K 11/0026* (2013.01); *B23K 11/16* (2013.01); *B23K 11/24* (2013.01); *B23K 20/002* (2013.01); *B23K 20/10* (2013.01); *H01L 31/022466* (2013.01)

(58) Field of Classification Search
CPC ... B23K 11/008; B23K 11/0026; B23K 11/16; B23K 11/24; B23K 20/002; B23K 20/10; B22F 1/0022; B22F 1/0025; B22F 1/0096; B03C 5/005; B82Y 40/00; B82Y 30/00; H01L 31/022466
USPC ........................................... 219/86.7
See application file for complete search history.

(56) References Cited

U.S. PATENT DOCUMENTS

| | | | |
|---|---|---|---|
| 8,323,744 B2 | 12/2012 | Connor et al. | |
| 9,754,702 B2 | 9/2017 | Choi et al. | |
| 2008/0119034 A1* | 5/2008 | Smirnov | H01L 21/306 438/606 |
| 2008/0292531 A1 | 11/2008 | Ganapathiraman et al. | |

(Continued)

FOREIGN PATENT DOCUMENTS

| | | | |
|---|---|---|---|
| DE | 102011111786.9 | * | 9/2011 |
| JP | 2008-246521 A | | 10/2008 |
| TW | 201309586 A1 | | 3/2013 |

OTHER PUBLICATIONS

EPO Search Report dated Jun. 17, 2015, for corresponding European Patent application 14199796.5, (7 pages).

(Continued)

*Primary Examiner* — Arthur O Hall
*Assistant Examiner* — Adam J Rogers
(74) *Attorney, Agent, or Firm* — Lewis Roca Rothgerber Christie LLP

(57) ABSTRACT

According to one or more embodiments of the present invention, a method for fusing metal nanowire junctions in a conductive film includes applying a constant current through the conductive film including a plurality of metal nanowires and a plurality of metal nanowire junctions, or conducting an ultrasonic welding of the metal nanowire junctions.

19 Claims, 8 Drawing Sheets

(56) References Cited

U.S. PATENT DOCUMENTS

| | | | |
|---|---|---|---|
| 2009/0038735 A1* | 2/2009 | Kian | G06K 19/07718 156/73.1 |
| 2010/0243295 A1* | 9/2010 | Allemand | B82Y 10/00 174/250 |
| 2011/0089160 A1* | 4/2011 | Kuriki | H05B 3/84 219/553 |
| 2011/0143161 A1* | 6/2011 | Schroth | B23K 20/103 428/594 |
| 2011/0204330 A1* | 8/2011 | LeMieux | B82Y 10/00 257/15 |
| 2011/0285019 A1 | 11/2011 | Alden et al. | |
| 2012/0018200 A1* | 1/2012 | Kim | B82Y 10/00 174/257 |
| 2012/0127097 A1 | 5/2012 | Gaynor et al. | |
| 2012/0132644 A1* | 5/2012 | Gu | H05B 3/145 219/553 |
| 2012/0138913 A1* | 6/2012 | Alsayed | B22F 1/0025 257/40 |
| 2013/0273315 A1* | 10/2013 | Mansky | H01B 7/00 428/138 |
| 2014/0311654 A1* | 10/2014 | Hansen | B29C 65/08 156/73.1 |
| 2015/0053459 A1* | 2/2015 | Fried | H05K 1/0274 174/251 |

OTHER PUBLICATIONS

Cai-Hong, et al.; Silver nanowire-based transparent, flexible, and conductive thin film; Nano Express; Nanoscale Research Letters 2011, 6:75, pp. 1-8.

Margulis, et al.; Spray Deposition of Silver Nanowire Electrodes for Semitransparent Solid-State Dye-Sensitized Solar Cells' Advanced Energy Materials 2013, vol. 3, pp. 1657-1663.

Spechler, et al.; Direct-write pulsed laser processed silver nanowire networks for transparent conducting electrodes; Rapid Communication; Applied Physics A Materials Science & Processing; Published online: May 10, 2012 (4 sheets).

* cited by examiner

METHOD FOR FUSING NANOWIRE JUNCTIONS IN CONDUCTIVE FILMS

CROSS-REFERENCE TO RELATED APPLICATION

This application claims priority to and the benefit of U.S. Provisional Application No. 61/920,402, filed on Dec. 23, 2013, the entire content of which is incorporated herein by reference.

BACKGROUND

1. Field

The following description relates generally to transparent and conductive films.

2. Description of the Related Art

Transparent conductive thin films have been widely used for devices such as Liquid Crystal Displays (LCDs), Organic Light Emitting Device (OLED) Displays, solar photovoltaics, touch screens, or electrochromic oxide-based films such as smart windows. Among these applications, indium tin oxide (ITO) has been used broadly to form the transparent conductive thin film due to its high electrical conductivity and high optical transparency. However, ITO requires high temperature for processing, and the ITO thin film is brittle and prone to cracking on flexible substrates. In addition, in order to lower the sheet resistance, the thickness of the ITO film has to be increased, which in turn leads to reduced light transmission and increased cost.

Transparent and conductive thin films formed from metal nanowires are among the most promising candidates as alternatives to ITO thin films. However, metal nanowires have good conductivity along the length of the nanowires, but have high contact resistance at the junctions where two or more nanowires cross one another.

SUMMARY

An aspect according to one or more embodiments of the present invention is directed toward a method for fusing metal nanowire junctions in a conductive film, where such a film may be coated on a substrate. The metal nanowires have reduced contact resistance, and the conductive film has good electrical conductivity as a result of the fusion of the metal nanowire junctions.

Additional aspects will be set forth in part in the description which follows and, in part, will be apparent from the description, or may be learned by practice of the presented embodiments.

According to an embodiment of the present invention, a method for fusing metal nanowire junctions in a conductive film includes applying a constant current through the conductive film including a plurality of metal nanowires and a plurality of metal nanowire junctions.

The applying of the constant current may be through a pair of electrodes facing each other.

The applying of the constant current may be through an array of electrodes.

The conductive film may be coated on a glass substrate or a plastic substrate. The substrate may be rigid, flexible, or stretchable. The substrate may be optically transparent or opaque.

The applying of the constant current through the conductive film may include: applying the constant current to a first section of the conductive film; advancing the conductive film; and applying the constant current to a second section of the conductive film.

The applying of the constant current may be performed as part of a roll-to-roll process. The constant current may be applied continuously during the roll-to-roll process. A speed of advancement of the roll may be varied to control a treatment time of the film.

According to an embodiment of the present invention, a method for fusing metal nanowire junctions in a conductive film includes conducting an ultrasonic welding of the conductive film including a plurality of metal nanowires and a plurality of metal nanowire junctions.

The ultrasonic welding may be conducted at a frequency of about 10 to 400 kHz, for example, 20 to 40 kHz.

The conducting of the ultrasonic welding may be through an array of ultrasonic heads.

The array of ultrasonic heads may be in contact with the conductive film during the conducting of the ultrasonic welding.

The array of ultrasonic heads may be separated from the conductive film by an air gap during the conducting of the ultrasonic welding.

The conductive film may be coated on a glass substrate or a plastic substrate. The substrate may be rigid, flexible, or stretchable. The substrate may be optically transparent or opaque.

The conducting of the ultrasonic welding of the conductive film may include: conducting the ultrasonic welding on a first section of the conductive film; advancing the conductive film; and conducting the ultrasonic welding on a second section of the conductive film.

The conducting of the ultrasonic welding may be performed as part of a roll-to-roll process. The ultrasonic welding may be applied continuously during the roll-to-roll process. A speed of advancement of the roll may be varied to control a treatment time of the film.

According to an embodiment of the present invention, a method of manufacturing part of a device includes applying at least one of a constant current or an ultrasonic welding through a conductive film including a plurality of metal nanowires and a plurality of metal nanowire junctions, wherein the device is a liquid crystal display, an organic light emitting device, a solar photovoltaic, a touch screen, or electrochromic oxide-based film.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
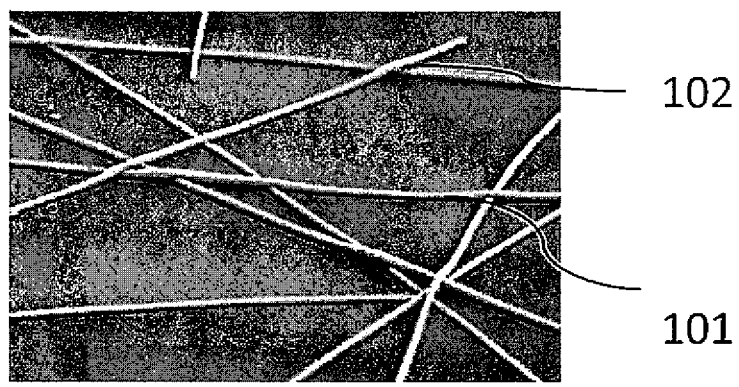
FIG. 1 is a scanning electron microscope image of a metal nanowire film.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present invention. The use of "may" when describing embodiments of the present invention refers to "one or more embodiments of the present invention." Expressions such as "at least one of," when preceding a list of elements, modify the entire list of elements and do not modify the individual elements of the list.

As the invention allows for various changes and numerous embodiments, particular embodiments will be illustrated in the drawings and described in more detail in the written description. The attached drawings for illustrating example embodiments of the present invention are referred to in order to gain a sufficient understanding of the present invention, the merits thereof, and the objectives accomplished by the implementation of the present invention.

It will be further understood that the terms "comprises" and/or "comprising" used herein specify the presence of the stated features or components, but do not preclude the presence or addition of one or more other features or components. Further, it will be understood that when a first element is referred to as being "coupled" or "connected" to a second element, it can be directly coupled or connected to the second element or intervening elements may be present.

Hereinafter, the present invention will be described in more detail by explaining example embodiments of the invention with reference to the attached drawings. Like reference numerals in the drawings denote like elements. Sizes of components in the drawings may be exaggerated for convenience of explanation. In other words, since sizes and thicknesses of components in the drawings are arbitrarily illustrated for convenience of explanation, the following embodiments are not limited thereto.

FIG. 1 is a scanning electron microscope image of a metal nanowire film, also referred to as a conductive film throughout this disclosure. The metal nanowire film includes a plurality of randomly oriented metal nanowires 101. A metal nanowire junction 102 is formed when two or more metal nanowires cross each other. Each metal nanowire 101 has good electrical conductivity along the length of the metal nanowire. However, the metal nanowire junction 102 has high contact resistance, due to the loose contact between the nanowires at the contact point, residual non-conductive materials from the formation process of the metal nanowire film, or other factors. While increasing the nanowire concentration along with post-treatment of film may reduce the film resistance, which may also lead to reduced film transparency, increased haze, and exposure to elevated temperature and pressure.

Silver nanowires, and other suitable metal nanowires (such as copper nanowires) may be utilized to form the nanowire conductive film. The conductive film may be formed on any suitable substrates. For example, the conductive film may be coated on a glass substrate or a plastic substrate. The substrate may be optically transparent or opaque. For example, the conductive film may be formed on a polymer substrate such as polyethylene terephthalate (PET), polyethylene naphthalate (PEN), polyimide (PI), or polymethyl methacrylate (PMMA). Other suitable polymeric substrates include those of polydimethylsiloxane (PDMS or silicone) in nature, where the substrates may be flexible and stretchable. Further, more rigid substrates, such as a glass substrate, a metal foil substrate, or any other suitable substrate of an optoelectronic device, known to those skilled in the art, may be utilized. Other elements for forming a device such as a liquid crystal display, an organic light emitting diode, a solar cell, or others, may be formed on top of this conductive layer. Alternatively, if the underlying layers are not affected by the wet process or method for forming and fusing nanowire junctions, the metal nanowire conductive film could be formed on top of the mentioned elements.

The conductive film including the metal nanowires may be formed utilizing any suitable methods. For example, the conductive film may be formed utilizing a solution formulation process, such as a spin coating process, a Meyer rod process, a slot die coating process, a gravure coating process, an offset printing process, a spray coating process, or an inkjet process. In a comparable process utilizing solution formulation process, typical small organic or organometallic molecules are attached to the nanowires that are suspended in a solution to reduce or to prevent the metal nanowires from coagulation in the solution. When the solution containing metal nanowires are deposited as a thin film on a substrate utilizing, for example, a spin coating process, the solvents and small organic or organometallic molecules are first removed through an evaporative process, which is often accelerated by a heating process. Heating of the metal nanowires also serve to anneal the conductive film. However, a subsequent sintering process that can significantly reduce the contact resistance between the metal nanowires often require a temperature that is over 150° C. and could be around 200° C. When the substrate is a polymeric material, and/or includes other elements for forming a device (such as an optoelectronic device), the heating process may cause damage to the substrate and/or the other elements of the device. Other alternative approaches require embedding of the metal nanowires in a conductive polymer film and the usage of pressure to force the nanowires to be in close contact with one another, which may distort the shape of the nanowires and may damage the other elements formed on the substrate. The method according to one or more embodiments of the present invention does not have these drawbacks.

Figure 2:
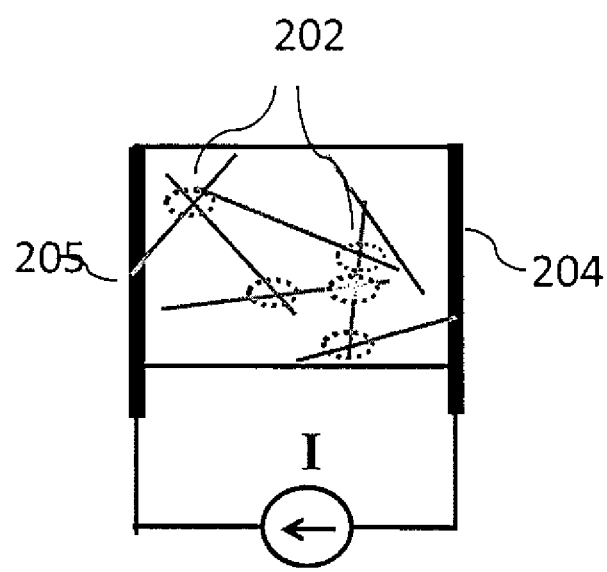
FIG. 2(a) is a schematic illustration of a constant current treatment on a metal nanowire film according to an embodiment of the present invention.
FIG. 2(b) is a schematic illustration of the conductive path of the nanowire film of FIG. 2(a)
Figure 2:
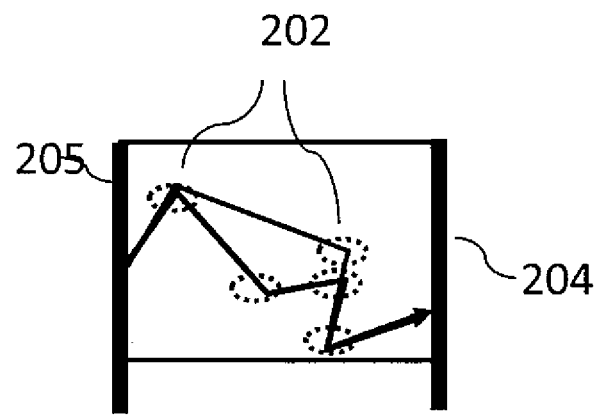

FIG. 2(a) is a schematic illustration of a constant current treatment on a metal nanowire film according to an embodiment of the present invention. Referring to FIG. 2(a), a pair of electrodes, for example, a negative electrode 204 and a positive electrode 205, is brought into contact with a surface of the nanowire film. For example, the pair of electrodes may be brought into contact with the same surface but along the opposing edges of the nanowire film. A constant current is applied to the nanowire film through the pair of electrodes.

This constant linear current density may be, for example, from 0.01 A/cm to 1 A/cm, and for a duration of time in the range of, for example, from 10 ms to 10 s.

FIG. 2(b) is a schematic illustration of the conductive path of the nanowire film of FIG. 2(a). Referring to FIG. 2(b), the electrical current passes from a first nanowire contacting the positive electrode 205 to a last nanowire contacting the electrode 204 through a number of nanowires and a number of junctions 202 (indicated by dotted lines) in between the two electrodes. According to example embodiments, the high contact resistance at the nanowire to nanowire junctions causes high local ohmic heating at the nanowire junctions. As such, the nanowire junctions are heated up to a higher temperature than the rest of the metal nanowire film, and in one embodiment, the temperature of the nanowire junctions could be 2 or more times the temperature of the substrate. For example, the local temperature across a metal nanowire junction may reach 200° C. or above where it is sufficient for the two nanowires crossing each other to sinter together, or at least partially fuse together, but the temperature in the rest of the film and particularly the substrate may stay below 100° C. The fusion of metal nanowires may therefore be achieved within temperature limits where the substrates or where the other elements of electrooptic device are not damaged.

In ohmic heating, the power is calculated according to equation 1.

$$P=I^2R \qquad \text{equation 1}$$

In equation 1, P is the power converted from electrical energy to thermal energy, I is the electrical current, and R is the electrical resistance.

In a nanowire film, the contact resistance may be from about 2 times the resistance of the nanowire along the length of the nanowire, to about 10,000 or more times the resistance of the nanowire along the length of the nanowire. Therefore, when a constant current is passed through a nanowire film, the temperature of the nanowire junctions may be much higher than the temperature of the rest of the nanowire. That is, the junctions are heated up so that the nanowires soften and are fused at the junctions where they cross each other, and the rest of the nanowire film remains at a lower temperature.

The metal nanowire film may be treated utilizing the constant current until a desired sheet resistance is achieved. For example, the sheet resistance of the nanowire film may be monitored continuously while a constant current is applied to the nanowire film. Once the sheet resistance reaches the desired value, the current can be stopped and, the manufacturing of a transparent conductive thin film is completed.

Figure 3:
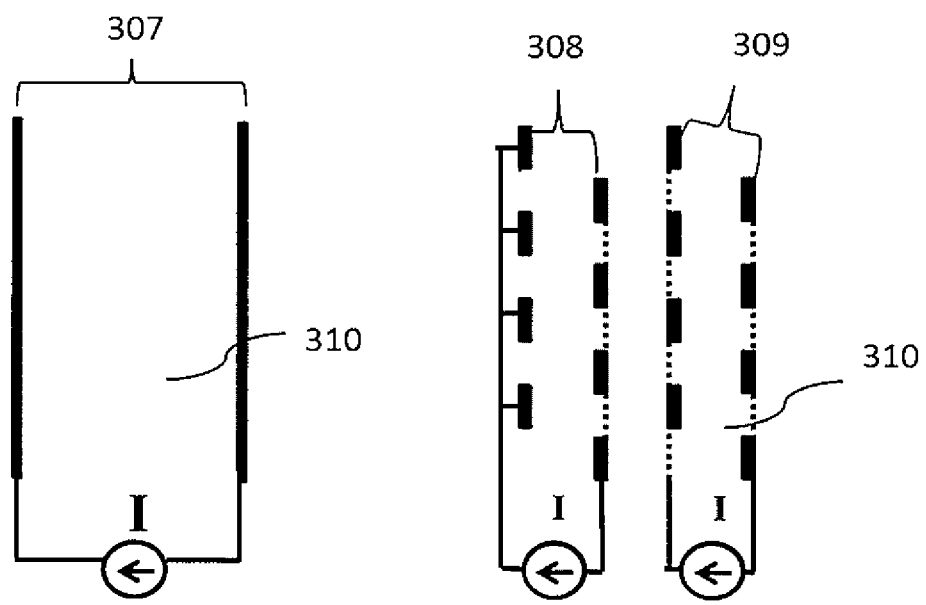
FIGS. 3(a)-3(b) are schematic illustrations of a constant current treatment on a metal nanowire film, each according to an embodiment of the present invention.

FIGS. 3(a) to 3(b) are schematic illustrations of a constant current treatment on a metal nanowire film. Referring to FIG. 3(a), in one embodiment, a pair of electrodes 307 is utilized to contact two opposing edges of a nanowire film 310 to conduct the constant current treatment. The electrodes span over the nanowire film 310.

Referring to FIG. 3(b), in another embodiment, two or more pairs of electrodes are utilized in treating a nanowire film. For example, a plurality of pairs of electrodes may form in a row or two rows (e.g., 308, 309) as illustrated in the FIG. 3(b) over the top surface of the nanowire film 310, and a constant current is applied between each pair of the electrodes. Nanowire junctions between a given pair of electrodes are fused accordingly. The pairs of electrodes may be arranged in a pattern to uniformly cover areas of the surface of the nanowire film and could be used to produce a uniform conductive film, e.g., a conductive film with more uniform resistance throughout the film. The electrodes are in physical contact with the conductive film and therefore electrically in contact but are not soldered to the film. By moving the metal nanowire film in a direction perpendicular to the electrode row direction while maintaining physical and electrical contact between the electrode and the film surface, the fusion of metal nanowire junctions can be obtained throughout the entire film.

Figure 4:
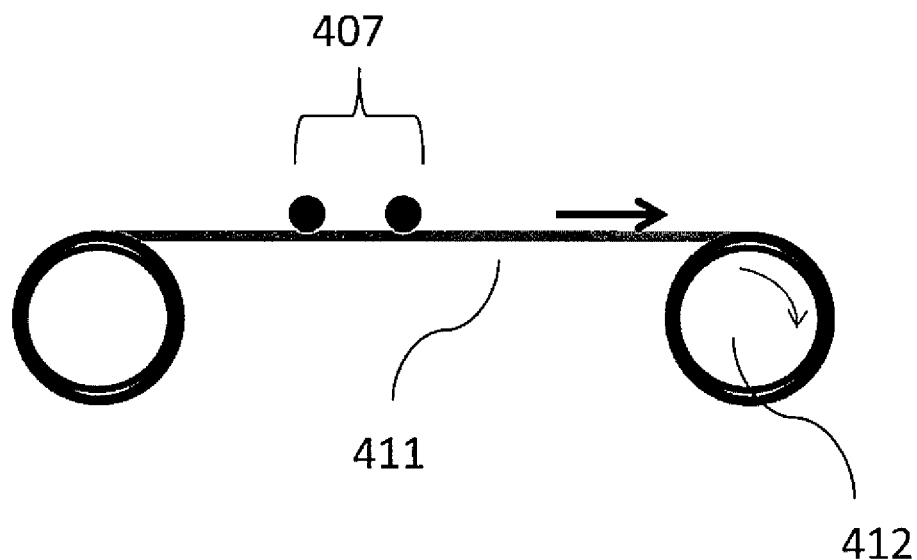
FIG. 4(a) is a side view of a constant current treatment applied on a roll-to-roll process according to an embodiment of the present invention.
FIGS. 4(b)-4(e) are schematic illustrations of a constant current treatment applied on a roll-to-roll process according to an embodiment of the present invention.
FIGS. 4(f)-4(g) are schematic illustrations of a constant current treatment applied on a roll-to-roll process, each according to an embodiment of the present invention.
Figure 4:
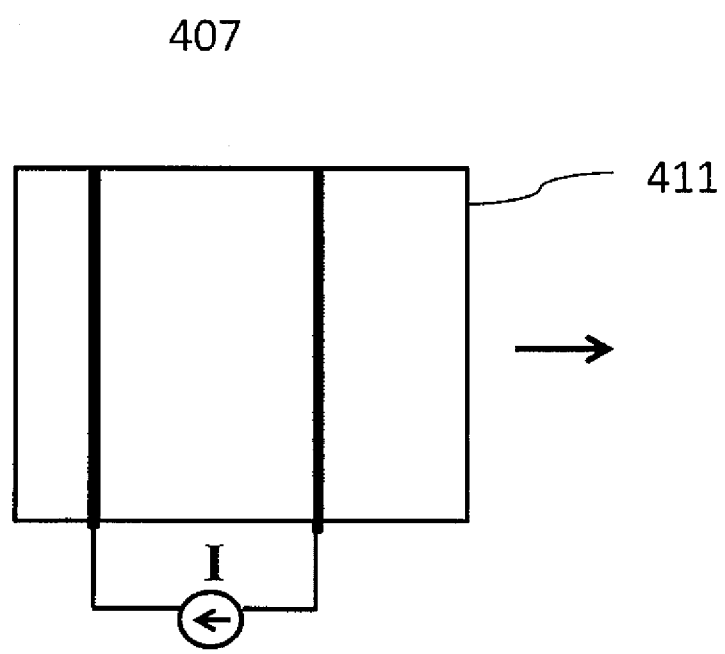
Figure 4:
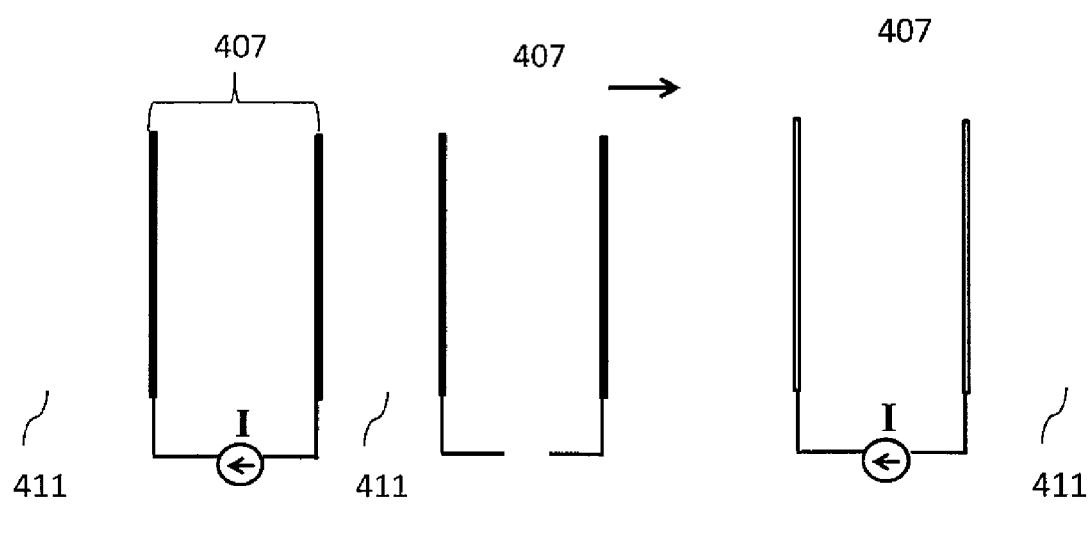
Figure 4:
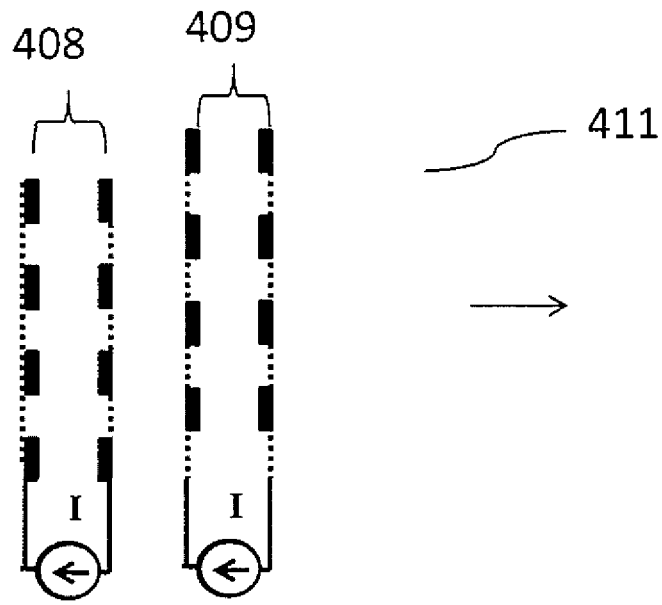
Figure 4:
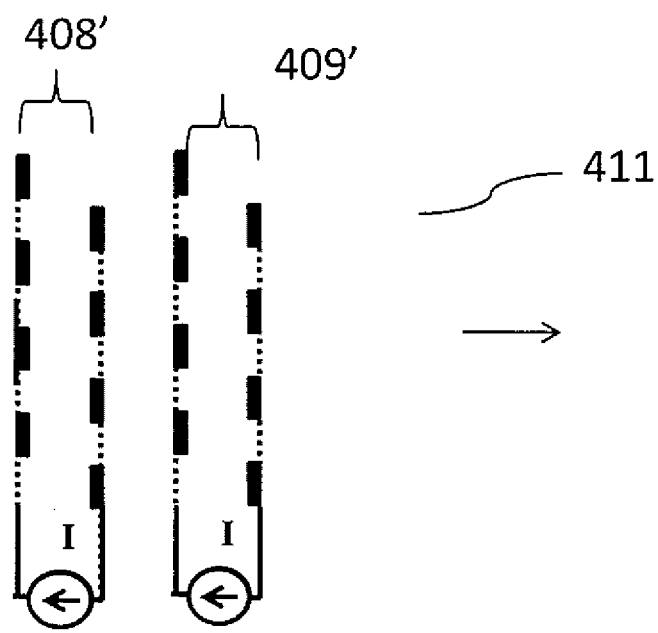

FIG. 4(a) is a side view of a constant current treatment applied on a roll-to-roll process according to an embodiment of the present invention; FIGS. 4(b)-4(e) are schematic illustrations (top view) of a constant current treatment applied on a roll-to-roll process according to an embodiment of the present invention; and FIGS. 4(f)-4(g) are schematic illustrations (top view) of a constant current treatment applied on a roll-to-roll process, each according to an embodiment of the present invention.

Referring to FIGS. 4(a) to 4(g), in one or more embodiments, the nanowire thin film is manufactured in a roll-to-roll web process. The nanowire film 411 may be deposited on a web, for example, a flexible substrate such as those made of PET or PEN substrate, utilizing a suitable wet deposition process and subsequent solvent evaporation and curing process compatible with the substrate. The nanowire film 411 and its substrate in this roll-to-roll process generally moves at a constant speed that is controlled by the angular velocity of its primary roller and subsequent slave rollers, which also sets the proper surface tension of the film. Here, a pair of electrodes 407 or a row of electrodes (e.g., 408, 409, 408' or 409',) may be placed over a section of the surface of the nanowire film 411 along a cross-web direction, that is, along a direction that is perpendicular to the direction the web film moves. In FIGS. 4(a)-4(g), the arrows indicate the direction the web film moves and the direction the roller 412 rotates. A constant current may be applied to the section of the nanowire film to fuse the metal nanowire junctions sandwiched between the electrodes. The electrodes can slide on the surface of the film to be in contact with the surface of the nanowire film such that when the web advances (e.g., moves relative to the electrodes), a different area of the nanowire film maybe treated. In this embodiment, the distance between the electrode, the web speed (from the two the duration of the treatment is defined), and the current applied determine the treatment condition. In another embodiment, the constant current drive can be turned off when the web advances, and be turned on when the web stops moving to conduct treatment on a different area of the film, if the web assumes a discrete, batch like process condition. The current drive could be left in an ON state, and the electrodes can be physically separated from the surface when the web advances and moved to contact the surface when the web stops moving. The current drive could be turned off and the electrodes kept in electrical contact with the surface when the web advances. In addition, the current drive could be turned off and electrodes removed from the surface when the web advances. The advancement in web allows for the treatment of the nanowire film in a different area in the nanowire film and ultimately the entire film. For example, as shown in FIG. 4(c), a pair of electrodes 407 comes in contact with a first section of the nanowire film 411, and a constant current is applied through the pair of electrodes 407. After the surface resistance reaches a set value, or after a set amount of time, the current flow is stopped and the web is advanced so that the next section (e.g., a second section) of the conductive film comes in contact with the pair of electrodes, as shown in FIG. 4(d).

Then the constant current treatment is conducted on this section (e.g., the second section) of the conductive film, as shown in FIG. 4(e). In this process, the current intensity between each pair of electrodes maybe adjusted to optimize the metal nanowire junction fusion process. Furthermore, additional rows of electrodes (see FIGS. 4(f)-4(g)) maybe added to reduce the time required to obtain desired sheet resistance of the metal nanowire films. The two electrodes forming a pair of electrodes through which the constant current is applied may be arranged symmetrically over the surface of the web (see FIG. 4(f), the electrodes in row 408 or 409), or asymmetrically (see FIG. 4(g), the electrodes in row 408' or 409'). In another embodiment, the constant current may be applied continuously between the electrodes as the web advances. Additionally, the speed of the web may be adjusted such that the desired fusion of the metal nanowire junctions is achieved. For example, the speed of advancement of the roll may be adjusted to slower when longer treatment time is needed.

According to another embodiment of the present invention, ultrasonic welding may be utilized to fuse the nanowire junctions. For example, a low amplitude acoustic vibration, such as an ultrasonic vibration at about 10 to 400 kHz, or 20 to 40 kHz, may be applied to fuse the nanowire junctions. In a simplified picture, the ultrasonic vibrations cause the nanowires to rub against each other at the junctions. The friction generates heat at the nanowire junctions and the generated heat fuses the nanowire junctions. According to example embodiments, for example, the frictional heat may heat the nanowires to a temperature high enough to remove those non-conductive additives and organometallic molecules from the surface of the nanowires and allow the metal atoms to move between the surfaces of the two crossing nanowires and form bonds to each other. The required temperature to fuse the metal nanowires together may be below the melting temperature of the nanowires, for example, the required temperature to fuse the metal nanowires together may be a fraction of the melting temperature of the metal nanowire.

In one embodiment, the ultrasonic generator may be directly in contact with the nanowire film during the ultrasonic welding process. The contact will allow for efficient transfer of acoustic energy to the film and may enhance the efficiency of nanowire fusion due to the ultrasonic welding process. The ultrasonic welding may move to a different area of the metal nanowire film when a desired sheet resistance in the area is achieved. In an alternative embodiment, the ultrasonic generator may not be in contact with the nanowire film, i.e., an air gap may exist between the ultrasonic generator and the nanowire film, and the acoustic vibrations or acoustic energy is transmitted to the film through the air gap. The desired feature of this embodiment is that this is a non-contact method, and there is reduced or minimized contamination and disturbance to the metal nanowire film. The air gap maybe as small as possible, for example, about 1 mm or less, to reduce the loss of the acoustic energy due to the air gap.

In one embodiment, an array of ultrasonic heads may be applied over the surface of the nanowire film to produce a nanowire film with more uniform conductivity.

In another embodiment, the nanowire film is manufactured in a roll-to-roll web process similar to the constant current treatment described above, and the ultrasonic welding is conducted continuously in the roll-to-roll process. The speed of advancement of the roll is varied to control the treatment time of the conductive film such that a desired sheet resistance can be achieved. For example, the speed of advancement of the roll may be adjusted to slower when longer treatment time is needed. In another embodiment, the web assumes a discrete, batch like process condition. After the nanowire film is formed on a section of the web, the formed nanowire film may be brought in contact with or under an ultrasonic head, or an array of ultrasonic heads. Ultrasonic vibration is then applied to the nanowire film and the treatment is completed once a set time or a desired sheet resistance is reached. The nanowire film is then advanced and the treated section of the nanowire film is transported to a next station for further processing, such as the addition of additional functional elements, or for rolling up. As a result of the advancement of the web, a new section of the nanowire film is brought in contact with or under the ultrasonic head, and the ultrasonic welding is conducted on this new section of the nanowire film.

Figure 5:
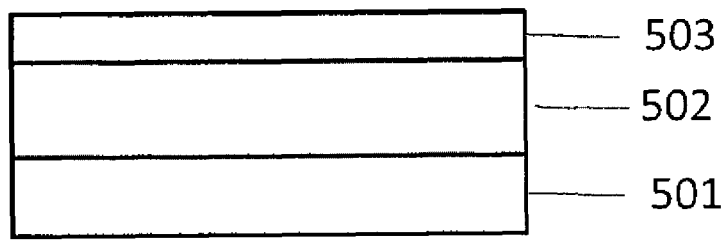
FIG. 5 is a schematic cross-sectional view of a device according to an embodiment of the present invention.

FIG. 5 is a schematic cross-sectional view of a device according to an embodiment of the present invention. The device may be a liquid crystal display, an organic light emitting device, a solar photovoltaic, a touch screen, or an energy efficient building material. The device includes a substrate 501, a conductive film 502, and a functional structure 503. The substrate 501 may be any suitable material for the corresponding device, such as a glass, a polymer material, etc. The conductive film 502 may be a transparent nanowire conductive film according to one or more embodiments of the present invention and functions as a transparent electrode of the device. The conductive film 502 may be deposited on a second substrate. In addition, the conductive film 502 may be deposited on the functional structure 503 or vice versa. The functional structure 503 may be a structure that completes the construction of the device together with the substrate 501 and the conductive film 502. Additional layers may be formed over the conductive film 502 or functional structure 503, such as a protective layer, a sealing layer, etc.

Figure 6:
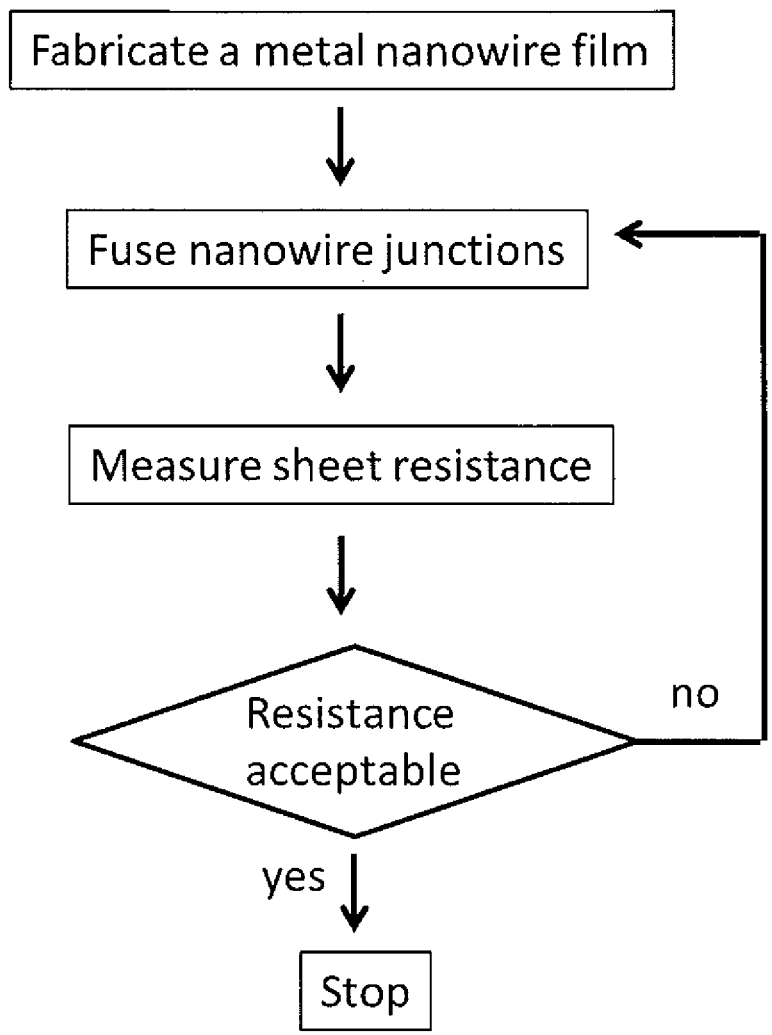
FIG. 6 is a flow-chart illustrating a method of fusing metal nanowire junctions in a conductive film according to an embodiment of the present invention.

FIG. 6 is a flow-chart illustrating a method of fusing metal nanowire junctions in a conductive film according to an embodiment of the present invention. The nanowires are deposited on a substrate to fabricate a nanowire conductive film including a plurality of metal nanowires and metal nanowire junctions. The metal nanowire junctions are fused. Here, the metal nanowire junctions may be fused utilizing the constant current method or the ultrasonic welding method. The sheet resistance of the nanowire conductive film is measured. If the measured resistance value is acceptable, the fusing of the metal nanowire junctions will be stopped and the conductive film is ready. If the measured resistance value is not acceptable, the metal nanowire junctions will be fused further through the constant current method or the ultrasonic welding method.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A method for fusing metal nanowire junctions in a conductive film, the method comprising:
   applying a constant current with a constant linear current density selected from 0.01 A/cm to 1 A/cm through the conductive film for a duration selected from 10 ms to 10 s to generate heat, the conductive film comprising a plurality of metal nanowires and a plurality of metal nanowire junctions, and
   fusing the metal nanowire junctions with the heat.

2. The method of claim 1, wherein the applying of the constant current is through a pair of electrodes facing each other.

3. The method of claim 1, wherein the applying of the constant current is through two or more pairs of electrodes.

4. The method of claim 1, wherein the conductive film is coated on a glass substrate or a plastic substrate.

5. The method of claim 1, wherein the conductive film is coated on a rigid substrate, a flexible substrate, or a stretchable substrate.

6. The method of claim 1, wherein the conductive film is coated on an optically transparent substrate or an opaque substrate.

7. The method of claim 1, wherein the applying of the constant current through the conductive film comprises:
   applying the constant current on a first section of the conductive film;
   advancing the conductive film; and
   applying the constant current on a second section of the conductive film.

8. The method of claim 1, wherein the applying of the constant current is performed as part of a roll-to-roll process, and a speed of advancement of the roll is varied to control a treatment time of the film.

9. A method for fusing metal nanowire junctions in a conductive film, the method comprising:
   conducting an ultrasonic welding of the conductive film to generate heat, the conductive film comprising a plurality of metal nanowires and a plurality of metal nanowire junctions, and
   fusing the metal nanowire junctions with the heat.

10. The method of claim 9, wherein the ultrasonic welding is conducted at a frequency of 10 to 400 kHz.

11. The method of claim 9, wherein the conducting of the ultrasonic welding is through two or more ultrasonic heads.

12. The method of claim 11, wherein the array of ultrasonic heads are in contact with the conductive film during the conducting of the ultrasonic welding.

13. The method of claim 11, wherein the array of ultrasonic heads are separated from the conductive film by an air gap during the conducting of the ultrasonic welding.

14. The method of claim 9, wherein the conductive film is coated on a glass substrate or a plastic substrate.

15. The method of claim 9, wherein the conductive film is coated on a rigid substrate, a flexible substrate, or a stretchable substrate.

16. The method of claim 9, wherein the conductive film is coated on an optically transparent substrate or an opaque substrate.

17. The method of claim 9, wherein the conducting of the ultrasonic welding of the conductive film comprises:
   conducting the ultrasonic welding on a first section of the conductive film;
   advancing the conductive film; and
   conducting the ultrasonic welding on a second section of the conductive film.

18. The method of claim 9, wherein the conducting of the ultrasonic welding is performed as part of a roll-to-roll process, and a speed of advancement of the roll is varied to control a treatment time of the film.

19. A method of manufacturing a device, comprising:
   applying at least one of a constant current or an ultrasonic welding through a conductive film to generate heat, the conductive film comprising a plurality of metal nanowires and a plurality of metal nanowire junctions, and
   fusing the metal nanowire junctions with the heat,
   wherein the device is a liquid crystal display, an organic light emitting device, a solar photovoltaic, a touch screen, or an electrochromic oxide-based film, and
   wherein the constant current has a constant linear current density selected from 0.01 A/cm to 1 A/cm and is applied for a duration selected from 10 ms to 10 s.

* * * * *